United States Patent
Song et al.

(10) Patent No.: US 11,817,298 B2
(45) Date of Patent: Nov. 14, 2023

(54) FOCUS RING, CHUCK ASSEMBLY FOR SECURING A SUBSTRATE AND PLASMA TREATMENT APPARATUS HAVING THE SAME

(71) Applicant: SAMSUNG ELECTRONICS CO., LTD., Suwon-si (KR)

(72) Inventors: Incheol Song, Hwaseong-si (KR); Masayuki Tomoyasu, Seongnam-si (KR); Hongmin Yoon, Hwaseong-si (KR); Jihyun Lim, Seoul (KR)

(73) Assignee: Samsung Electronics Co., Ltd.

( * ) Notice: Subject to any disclaimer, the term of this patent is extended or adjusted under 35 U.S.C. 154(b) by 462 days.

(21) Appl. No.: 17/108,037

(22) Filed: Dec. 1, 2020

(65) Prior Publication Data
US 2021/0305021 A1    Sep. 30, 2021

(30) Foreign Application Priority Data
Mar. 26, 2020   (KR) .......................... 10-2020-0036800

(51) Int. Cl.
*H01J 37/32*    (2006.01)

(52) U.S. Cl.
CPC .. *H01J 37/32642* (2013.01); *H01J 37/32174* (2013.01); *H01J 37/32715* (2013.01); *H01J 2237/3341* (2013.01)

(58) Field of Classification Search
CPC ........... H01J 37/32642; H01J 37/32174; H01J 37/32715; H01J 2237/3341; H01J 37/32431; B23Q 3/15; H01L 21/67069; H01L 21/6833; H02N 13/00
See application file for complete search history.

(56) References Cited

U.S. PATENT DOCUMENTS

| | | | |
|---|---|---|---|
| 7,988,814 B2 | 8/2011 | Koshiishi | |
| 8,522,716 B2 | 9/2013 | Kadkhodayan et al. | |
| 8,981,263 B2 | 3/2015 | Sasaki et al. | |
| 9,196,512 B2 | 11/2015 | Kobayashi et al. | |
| 2018/0204757 A1* | 7/2018 | Fushimi | H01J 37/32174 |
| 2021/0104383 A1* | 4/2021 | Sasaki | H01L 21/68735 |
| 2021/0296098 A1* | 9/2021 | Cho | H01L 21/68735 |

FOREIGN PATENT DOCUMENTS

| | | |
|---|---|---|
| CN | 105990085 A  * | 10/2016 |
| JP | 2007-258500 A | 10/2007 |
| JP | 6430233 B2 | 11/2018 |

OTHER PUBLICATIONS

Translation of CN-105990085-A; 2016 (Year: 2016).*
(Continued)

*Primary Examiner* — Renan Luque
(74) *Attorney, Agent, or Firm* — Fish & Richardson P.C.

(57) ABSTRACT

A focus ring includes a first conductive layer having a first thickness and a first specific resistance, a second conductive layer stacked on the first conductive layer, the second conductive layer having a second thickness greater than the first thickness and a second specific resistance greater than the first specific resistance, and a dielectric layer on one of a lower surface of the first conductive layer and an upper surface of the second conductive layer.

17 Claims, 6 Drawing Sheets

(56) References Cited

OTHER PUBLICATIONS

Yang et al., "Graded conductivity electrodes as a means to improve plasma uniformity in dual frequency capacitively coupled plasma sources," J. Phys. D: Appl. Phys., 43, 152001 (5pp) (2010).
Liu et al., "Plasma non-uniformity in a symmetric radiofrequency capacitively-coupled reactor with dielectric side-wall: a two dimensional particle-in-cell/Monte Carlo collision simulation," Plasma Sources Sci. Technol., 27, 025006 (12pp) (2018).

* cited by examiner

FOCUS RING, CHUCK ASSEMBLY FOR SECURING A SUBSTRATE AND PLASMA TREATMENT APPARATUS HAVING THE SAME

CROSS-REFERENCE TO RELATED APPLICATION

Korean Patent Application No. 10-2020-0036800, filed on Mar. 26, 2020, in the Korean Intellectual Property Office, and entitled: "Focus Ring, Chuck Assembly for Securing a Substrate and Plasma Treatment Apparatus Having the Same."

BACKGROUND

1. Field

Example embodiments relate to a focus ring, a chuck assembly for securing a substrate and a plasma treatment apparatus having the same, and more particularly, to a focus ring around a chuck assembly, to which a high frequency power for generating plasma is applied, and a chuck assembly and a plasma etching apparatus having the focus ring.

2. Description of the Related Art

Density uniformity of plasma may affect the etching quality of the plasma etching process. Thus, a focus ring is usually provided with most of the plasma etching apparatuses. The focus ring may be arranged around a chuck, to which a substrate is secured, and the substrate is enclosed by the focus ring. The plasma in the plasma space is focused onto the substrate by the focus ring, thereby increasing the plasma density on the substrate. The chuck for securing the substrate and the focus ring for focusing the plasma onto the substrate around the chuck may be combined into a chuck assembly that is a lower structure of the plasma treatment apparatus.

SUMMARY

According to example embodiments, there is provided a focus ring including a first conductive layer having a first thickness and a first specific resistance, a second conductive layer stacked on the first conductive layer and having a second thickness greater than the first thickness and a second specific resistance greater than the first specific resistance, and a dielectric layer arranged on one of a lower surface of the first conductive layer and an upper surface of the second conductive layer.

According to other example embodiments, there is provided a chuck assembly including a chuck dielectric plate including a dielectric material and to which the substrate may be secured, a chuck body including a conductive material and supporting the chuck dielectric plate such that at least a high frequency power may be applied to the chuck body, and a focus ring arranged on a peripheral portion of the chuck body such that the substrate may be enclosed with the focus ring and the focus ring may include a composite conductive layer in which at least two conductive layers having different specific resistance may be stacked and a ring dielectric layer arranged on one of a lower surface and an upper surface of the composite conductive layer.

According to yet other example embodiments, there is provided a plasma treatment apparatus for conducting a plasma treatment process to a substrate. The plasma treatment apparatus may include a process chamber having a process space in which the plasma treatment process may be conducted, a source supplier arranged at an upper portion of the process chamber and supplying source gases for the plasma treatment process, a chuck assembly arranged at a lower portion of the process chamber and securing the substrate, and a power supplier applying at least a high frequency power to the chuck assembly and generating a plasma for the plasma treatment process in the process space. Particularly, the chuck assembly may include a chuck dielectric plate including a dielectric material and to which the substrate may be secured, a chuck body including a conductive material and supporting the chuck dielectric plate such that at least the high frequency power may be applied to the chuck body, and a focus ring arranged on a peripheral portion of the chuck body such that the substrate may be enclosed with the focus ring. The focus ring may include a composite conductive layer in which at least two conductive layers having different specific resistance may be stacked and a ring dielectric layer arranged on one of a lower surface and an upper surface of the composite conductive layer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
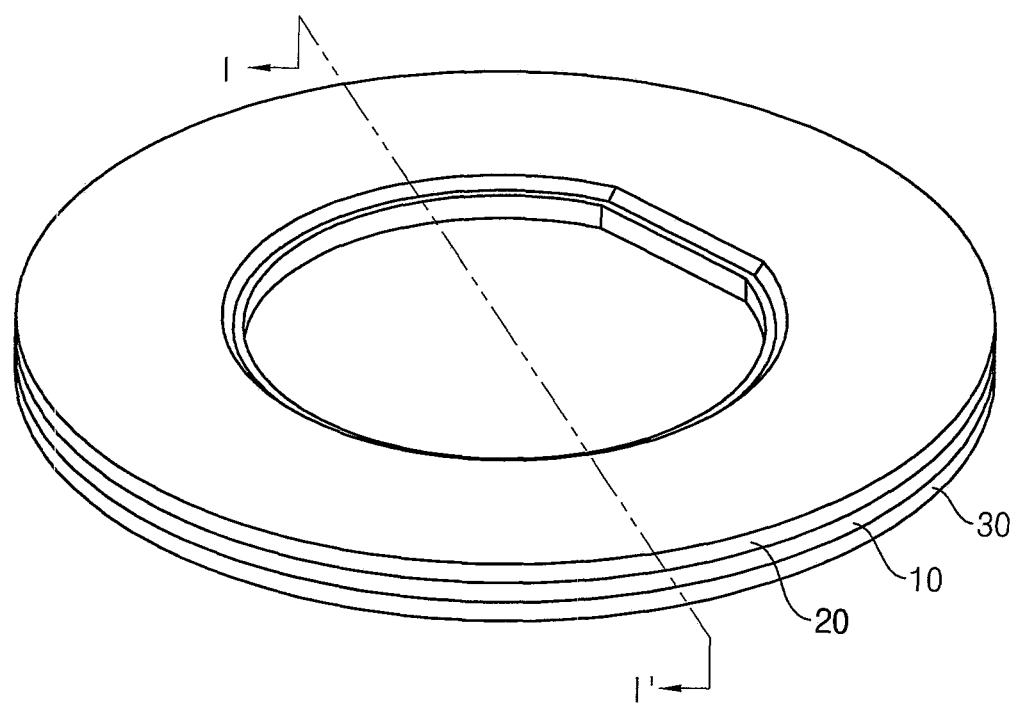
FIG. 1 is a perspective view illustrating a focus ring for a chuck assembly in accordance with an example embodiment.

Reference will now be made to example embodiments, which are illustrated in the accompanying drawings, wherein like reference numerals refer to like components throughout.

Figure 2:
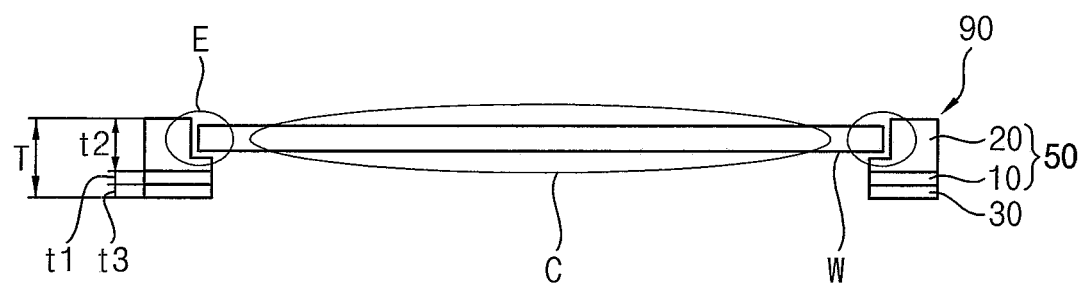
FIG. 2 is a cross sectional view illustrating a configuration of the focus ring shown in FIG. 1 in relation with a substrate.

FIG. 1 is a perspective view illustrating a focus ring for a chuck assembly in accordance with an example embodiment. FIG. 2 is a cross sectional view along line I-I' of the focus ring shown FIG. 1.

Referring to FIGS. 1 and 2, a focus ring 90 in accordance with an example embodiment may include a first conductive layer 10 having a first specific resistance pi and a first thickness $t_1$, a second conductive layer 20 stacked on the first conductive layer 10 and having a second specific resistance $\rho_2$ greater than the first specific resistance $\rho_1$ and a second thickness $t_2$ greater than the first thickness $t_1$, and a dielectric layer 30 arranged on at least one of a lower surface of the first conductive layer 10 and an upper surface of the second conductive layer 20. For example, as illustrated in FIGS. 1 and 2, the dielectric layer 30 may be arranged under the first conductive layer 10 in such a configuration that the dielectric layer 30, the first conductive layer 10, and the second conductive layer 20 may be sequentially stacked on each other, e.g., the first conductive layer 10 may be between the second conductive layer 20 and the dielectric layer 30.

In the present example embodiment, the focus ring 90 may be combined to a chuck assembly for a plasma etching process using chlorine fluoride ($Cl_xF_y$) as source gases.

In the present example embodiment, a high frequency power may be applied to a lower portion of the chuck assembly and may be transmitted through a substrate W and the focus ring 90, to thereby generate the plasma for the plasma etching process in a plasma space over the substrate W and the focus ring 90. The high frequency power transmitting through the focus ring 90 may generate the plasma over the focus ring 90 and a peripheral portion E of the substrate W and the high frequency power transmitting through the substrate W may generate the plasma over most of the substrate W except for the peripheral portion E. Hereinafter, the portion of the substrate W except for the peripheral portion E may be referred to as a central portion C, e.g., the peripheral portion E may refer to an edge portion of the substrate.

The first conductive layer 10 may have such a specific resistance and a thickness that the attenuation of the high frequency power through the first conductive layer 10 may be substantially the same as the attenuation of the high frequency power through the substrate W. For that reason, the first conductive layer 10 may have the first specific resistance $\rho_1$ and the first thickness $t_1$. In contrast, the second conductive layer 20 may have such a specific resistance and a thickness that the high frequency power transmitted through the first conductive layer 10 may transmit through the second conductive layer 20 substantially without attenuation. For that reason, the second conductive layer 20 may have the second specific resistance $\rho_2$ and the second thickness $t_2$.

For example, the second specific resistance $\rho_2$ may be about 10 times to about 100 times the first specific resistance $\rho_1$ that may attenuate the high frequency power substantially the same as the attenuation of the high frequency power transmitting through the substrate W. In the present example embodiment, the first specific resistance pi may be in a range of about 10 $\Omega$/cm to about 100 $\Omega$/cm.

The second conductive layer 20 may be stacked on the first conductive layer 10, and the high frequency power may transmit sequentially through the first conductive layer 10 and the second conductive layer 20 of the focus ring 90 toward the plasma space.

In detail, the second conductive layer 20 may have a specific resistance that is sufficiently greater than that of the first conductive layer 10, such that the high frequency power may be transmitted through the second conductive layer 20 substantially without attenuation. Thus, a central intensity of the high frequency power, which is an intensity of the high frequency power transmitted through the chuck and the substrate W at the central portion C of the substrate W, may be proximate to a peripheral intensity of the high frequency power, which is an intensity of the high frequency power transmitted through the focus ring 90 around the peripheral portion E of the substrate W. That is, the intensity difference of the high frequency power transmitted through the substrate W and the focus ring 90 may be minimized by the first and the second conductive layers 10 and 20 of the focus ring 90.

The second conductive layer 20 may be directly exposed to the plasma in the plasma treatment process, i.e., to the plasma in the plasma space above the second conductive layer 20 of the focus ring 90. Thus, the second conductive layer 20 may include etch-resistive materials, e.g., to protect against the plasma over the focus ring 90.

The first conductive layer 10 may be covered by the second conductive layer 20, and therefore, the first conductive layer 10 may not be directly exposed to the plasma in the plasma treatment process. Thus, no thickness loss may occur in the first conductive layer 10 in spite of the repeated plasma treatment process. As the high frequency power may be attenuated when transmitted through the first conductive layer 10 and no substantial attenuation of the high frequency power may occur during transmittance through the second conductive layer 20, an overall attenuation of the high frequency power may be controlled just by controlling the configurations of the first and the second conductive layers 10 and 20. That is, the first and the second conductive layers 10 and 20 may function as a composite conductive layer 50 for controlling the overall attenuation of the high frequency power transmitted through the focus ring 90.

In the present example embodiment, the first conductive layer 10 may include doped silicon (Si) having the first specific resistance $\rho_1$ of about 100 $\Omega$/cm. The second conductive layer 20 may include doped silicon carbide (SiC) having the second specific resistance $\rho_2$ of about 1,000 $\Omega$/cm to about 10,000 $\Omega$/cm.

However, the first and the second conductive layers 10 and 20 may include any other conductive materials as long as the high frequency power may be sufficiently transmitted with high-controlled attenuation. Particularly, the second conductive layer 20 may include various conductive materials as long as the conductive materials have a sufficient etch-resistance at a high temperature and no particles are generated from the conductive materials.

The first thickness $t_1$ of the first conductive layer 10 may be determined in relation with the first specific resistance $\rho_1$ in such a way that the attenuation of the high frequency power transmitted through the first conductive layer 10 may be substantially the same as the attenuation of the high frequency power transmitted through the substrate W. For example, when the first conductive layer 10 includes the same material as the substrate W, the thickness of the conductive layer 10 may be substantially the same as the thickness of the substrate W.

The second conductive layer 20 may have the second thickness $t_2$ corresponding to the rest, e.g., remainder, of a total thickness of the focus ring 90 except for the first conductive layer 10 and the dielectric layer 30. For example, as illustrated in FIG. 2, a sum of the second thickness $t_2$ of the conductive layer 20, the first thickness $t_1$ of the first conductive layer 10, and a thickness of the dielectric layer 30 may constitute the total thickness of the focus ring 90.

The total thickness of the focus ring 90 may be varied according to the requirements of the plasma treatment process and the characteristics of the chuck assembly. In the present example embodiment, the focus ring 90 may have a total thickness of about 3 mm to about 6 mm. Thus, the second thickness $t_2$ of the second conductive layer 20 may be determined as the difference between the total thickness of the focus ring 90 and a summation of the thicknesses of the first conductive layer 10 and the dielectric layer 30.

The dielectric layer 30 may reduce the phase difference of the high frequency power when the high frequency power is transmitted through the focus ring 90 and the substrate W. For example, the dielectric layer 30 may include at least one of aluminum oxide ($Al_2O_3$), yttrium oxide ($Y_2O_3$), aluminum nitride (AlN), quartz and compositions thereof.

In detail, as the chuck and the substrate W of the chuck assembly may include resistive materials and dielectric materials, and the high frequency power may be transmitted though the chuck and the substrate W toward the plasma space, the chuck and the substrate W may be simplified as an RC circuit when the high frequency power is applied to the lower portion of the chuck assembly. Thus, the high frequency power may have a time delay at the substrate W due to the resistance of the resistive materials and the capacitance of the dielectric materials. Accordingly, when the high frequency power is transmitted through the substrate W and the focus ring 90, a phase difference may occur between the transmitted power at the substrate W and the transmitted power at the focus ring 90. Hereinafter, the high frequency power applied to the lower portion of the chuck assembly is referred to as applied power signal and the high frequency power that is transmitted through the substrate W or the focus ring 90 is referred to as transmission power signal.

The phase difference of the transmission power signal is generally caused by both of the resistance and the capacitance. However, the phase difference of the transmission power signal may be caused by the capacitance much more than by the resistance. Accordingly, when the capacitance of the focus ring 90 is substantially the same as that of the chuck of the chuck assembly, the phase difference of the transmission power signal may be minimized between upper portions of the substrate and the focus ring 90. That is, when the focus ring 90 has the same capacitance as that of the chuck in the chuck assembly, the phase difference of the transmission power signal at the focus ring 90 may be approximate to that of the transmission power signal at the substrate W, although not being identical to each other.

In the present example embodiment, a third thickness $t_3$ of the dielectric layer 30 may be adjusted such that the capacitance of the dielectric layer 30 may be substantially the same as that of a dielectric body of the chuck. Thus, a total thickness T of the focus ring 90 may be the sum of the first, second, and third thicknesses $t_1$, $t_2$, and $t_3$, and may be in a range of about 3 mm to about 6 mm.

The first conductive layer 10 and the second conductive layer 20 may be combined to each other without any intermediates as the composite conductive layer 50 of the focus ring 90. For example, the first and the second conductive layers 10 and 20 may be combined or bonded to each other by a diffusion bonding process.

In detail, the first and the second conductive layers 10 and 20 may be compressed to each other by pressure, and then may be heated to a temperature under a melting point of the first and the second conductive layers 10 and 20. In such circumstances, the atoms of the first and the second conductive layers 10 and 20 may be inter-diffused to each other at the interface between the first and the second conductive layers 10 and 20, i.e., on the contact surface, to thereby be bonded or combined into the, e.g., single, composite conductive layer 50.

In a modified example embodiment, the first and the second conductive layers 10 and 20 may be combined to each other by a room temperature bonding process. In this case, each of the contact surfaces of the first and the second conductive layers 10 and 20 may be activated by an ion sputtering process or a plasma treatment process, and then may be brought into contact with each other. Then, the activated contact surfaces of the first and the second conductive layers 10 and 20 may be combined or bonded to each other by an intrinsic welding energy of the first and the second conductive layers 10 and 20. Thus, the first and the second conductive layers 10 and 20 may be combined into the composite conductive layer 50 at room temperature.

As a conductive body and a dielectric body can be combined or bonded to each other by the room temperature bonding process, the dielectric layer 30 and the composite conductive layer 50 may be combined to each other by the room temperature bonding process.

In another modified example embodiment, the first and the second conductive layers 10 and 20 may be adhered to each other by an adhesive. In the same way, the composite conductive layer 50 and the dielectric layer 30 may be adhered to each other by an adhesive. In detail, the adhesive may have good heat transfer characteristics, and thus the heat may be sufficiently well transferred among the first conductive layer 10, the second conductive layer 20, and the dielectric layer 30 in the focus ring 90 when conducting the plasma treatment process. In such a case, the thickness and the dielectric constant of the adhesive may be determined in such a way that the phase loss of the high frequency power may be minimized whenever transmitted through the adhesive.

Figure 3:
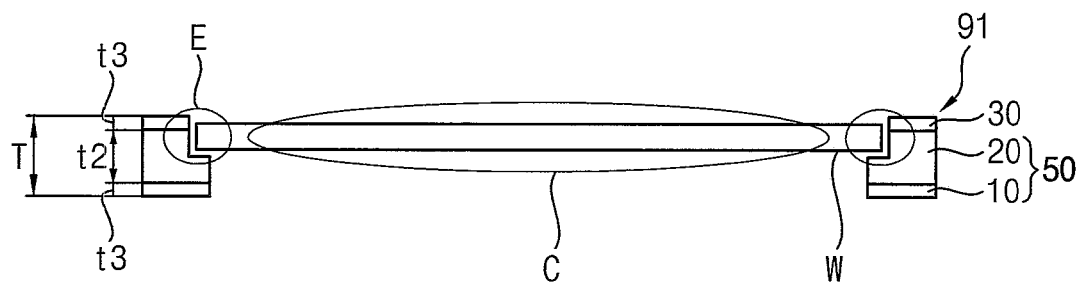
FIG. 3 is a view illustrating a configuration of a modification of the focus ring shown in FIG. 2 in relation with a substrate.

FIG. 3 is a view illustrating a configuration of a modification of the focus ring shown in FIG. 2. The modified focus ring in FIG. 3 may have substantially the same configurations as the focus ring 90 shown in FIG. 2, except for the position of the dielectric layer 30. Thus, in FIG. 3, same reference numerals denote the same elements as in FIG. 2, and any further detailed descriptions of the same elements will be omitted hereinafter.

Referring to FIG. 3, in a modified focus ring 91, the dielectric layer 30 may be arranged on the composite conductive layer 50, i.e., the second conductive layer 20 may be between the dielectric layer 30 and the first conductive layer 10. Thus, the plasma may be in direct contact with the dielectric layer 30 during the plasma treatment process.

In detail, the modified focus ring 91 may include the composite conductive layer 50 and the dielectric layer 30 on the composite conductive layer 50. Therefore, the first conductive layer 10, the second conductive layer 20, and the dielectric layer 30 may be sequentially stacked on each other in the modified focus ring 91.

When thermal resistance is required rather than etch resistance during the plasma treatment process, the second conductive layer 20 including silicon carbide (SiC) is exposed to the plasma space, as disclosed in the focus ring 90 shown in FIG. 2. In contrast, when etch resistance is required rather than thermal resistance during the plasma treatment process, the dielectric layer 30, e.g., including quartz or aluminum oxide ($Al_2O_3$), is exposed to the plasma space, as disclosed in the modified focus ring 91 shown in FIG. 3.

The thickness and material of the dielectric layer 30 may be varied according to the capacitance and the etch resistance with respect to the etch plasma in the plasma treatment process. For example, when the plasma etch process is conducted by using chlorine ($Cl_2$) gas or bromide hydrogen (HBr) gas as a source gas, the dielectric layer 30 may include quartz because of its low cost and good workability.

According to the example embodiments of the focus ring, the attenuation of the transmission power signal through the substrate W may be substantially the same as that of the transmission power signal through the focus ring 90 or the modified focus ring 91, so that the intensity of the electric field caused by the transmission power signal may be uniform across the substrate W to the focus ring. Therefore, the plasma density may also be substantially uniform from the central portion C to the peripheral portion E of the substrate W and the plasma etching may be conducted uniformly across the whole surface of the substrate W.

Figure 4:
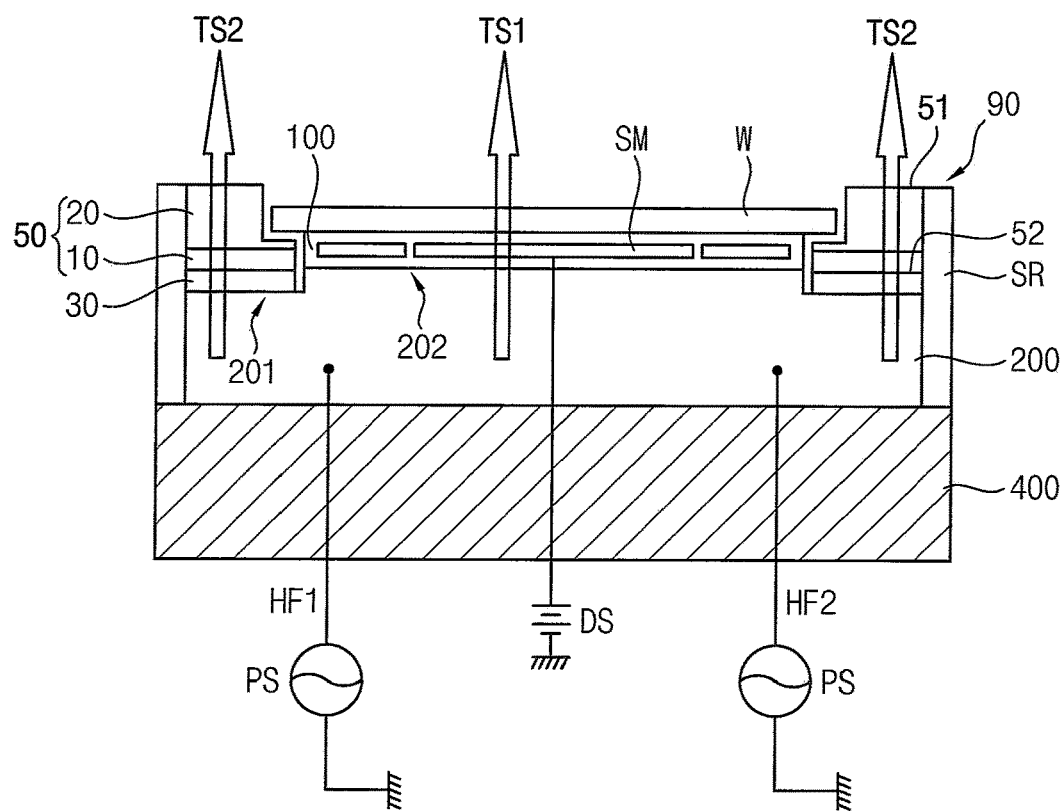
FIG. 4 is a structural view illustrating a chuck assembly including the focus ring shown in FIGS. 1 and 2 in accordance with an example embodiment.

FIG. 4 is a structural view illustrating a chuck assembly including the focus ring 90 of FIGS. 1 and 2 in accordance with an example embodiment. While FIG. 4 illustrates a chuck assembly including the focus ring 90, the chuck assembly can be constructed similarly with the focus ring 91 of FIG. 3.

Referring to FIG. 4, a chuck assembly 500 in accordance with an example embodiment may include a chuck dielectric plate 100 including a first dielectric material and onto which the substrate W may be secured, a chuck body 200 supporting the chuck dielectric plate 100 and including a chuck conductive material to which at least a high frequency power may be applied, the focus ring 90 arranged on a peripheral portion of the chuck body 200 and enclosing the substrate W, and an insulating plate 400 supporting the chuck body 200. As described previously with reference to FIGS. 1 and 2, the focus ring 90 may include the composite conductive layer 50 configured to a multilayer structure having different electrical resistances and the dielectric layer 30 on at least one of an upper surface 51 and a lower surface 52 of the composite conductive layer 50.

For example, the chuck dielectric plate 100 may include a dielectric bulk disc that may be adhered to the chuck body 200 by an adhesive. The chuck dielectric plate 100 may include a ceramic material, e.g., aluminum oxide ($Al_2O_3$), aluminum nitride (AlN), and yttrium oxide ($Y_2O_3$).

The substrate W may be secured to the chuck dielectric plate 100, and a plasma treatment process, e.g., a plasma etch process, may be conducted on the substrate W. For example, the substrate W may include a silicon wafer, on which fine pattern structures for semiconductor devices are to be formed, or a glass substrate, on which fine pattern structures for flat display panels are to be formed.

At least a securing member SM may be provided with the chuck dielectric plate 100, thus the substrate W may be secured to the chuck dielectric plate 100 by using the securing member SM. For example, the securing member SM may include a securing electrode that may be arranged in the chuck dielectric plate 100 and be connected with an external direct current source (DS), e.g., the securing member SM may be a securing electrode. An electric static force may be generated from the electrode, and the substrate W may be secured to the chuck dielectric plate 100 by the electrostatic force. Thus, the chuck assembly 500 may be provided as an electrostatic chuck (ESC) structure. The securing electrode may be shaped into one of a ring shape, a semi-circular shape and combinations of at least two semi-circular shapes.

The securing member SM may also include a mechanical joint for joining the substate W to the chuck dielectric plate 100 by using frictional forces. In the present example embodiment, the mechanical joint may include a clamp, and the chuck assembly 500 may be provided as a frictional chuck structure.

A heat electrode may be further provided in the chuck dielectric plate 100 for heating the substrate W to a predetermined temperature during the plasma etching process. A Joule heat may be generated from the heat electrode, and the substrate W may be heated by the Joule heat. The heat electrode may be shaped into a concentric circle or a spiral shape with respect to a center point of the disk-shaped chuck dielectric plate 100.

The chuck body 200 may be shaped into a bulk disk to support the disk-shaped chuck dielectric plate 100, and may include a conductive material, e.g., aluminum (Al), titanium (Ti), tungsten (W), stainless steel and compositions thereof. The configurations of the chuck body 200 may be varied according to the requirements of the chuck assembly 500 and the configurations of the plasma treatment apparatus having the chuck assembly 500.

In detail, the chuck body 200 may have a stepped portion 201 in such a configuration that a central portion may protrude higher than a peripheral portion. Thus, a protruding portion 202 of the chuck body 200 may be a central portion of the chuck body 200 that protrudes above the peripheral portion to define the stepped portion 201 in the periphery of, e.g., and around, the protruding portion 202. The protruding portion 202 may contact, e.g., a bottom of, the chuck dielectric plate 100, and the stepped portion 201 of the chuck body 200 may contact, e.g., a bottom of, the focus ring 90.

When applied to the chuck body 200, the high frequency power may be transmitted to the plasma space over the substrate W through the substrate W and the focus ring 90. Thus, the plasma may be generated in the plasma space and be guided toward the substrate W during the plasma treatment process. The high frequency power may include a first power HF1 for generating the plasma and a second power HF2 for guiding the plasma to the substrate W.

The first power HF1 may include an alternative current (AC) power supply having a frequency of about 10 MHz to about 100 MHz and may supply sufficient energy for changing source gases in the plasm space over the substrate W into the plasma. In the present example embodiment, the first power HF1 may include a radio frequency (RF) power having a frequency of about 13.56 MHz. The second power HF2 may include an alternative current (AC) power supply having a frequency higher than about 1 MHz and lower than about 10 MHz and may accelerate the charged particles of the plasma toward the substrate W. Thus, the plasma treatment process may be conducted on the substrate W.

The high frequency power applied to the chuck body 200 may be transmitted through the protruding portion 202 of the chuck body 200 and the substrate W, as a first transmission power signal TS1, and may be transmitted through the focus ring 90 having the composite conductive layer 50 and the dielectric layer 30, as a second transmission power signal TS2. The first transmission power signal TS1 may generate the plasma over the central portion C of the substrate W and the second transmission power signal TS2 may generate the plasma over the peripheral portion E of the substrate W.

Thus, the chuck dielectric plate 100 and the substrate W may function as a first transmission line, e.g., path, for transmitting the first transmission power signal TS1 from the chuck body 200. The dielectric layer 30 and the composite conductive layer 50 of the focus ring 90 may function as a second transmission line, e.g., path, for transmitting the second transmission power signal TS2 from the chuck body 200. The first and second transmission lines may be referred to as first and the second transmission lines TL1 and TL2, as illustrated and described in more detail below with reference to FIGS. 6A and 6B, respectively.

Figure 6A:
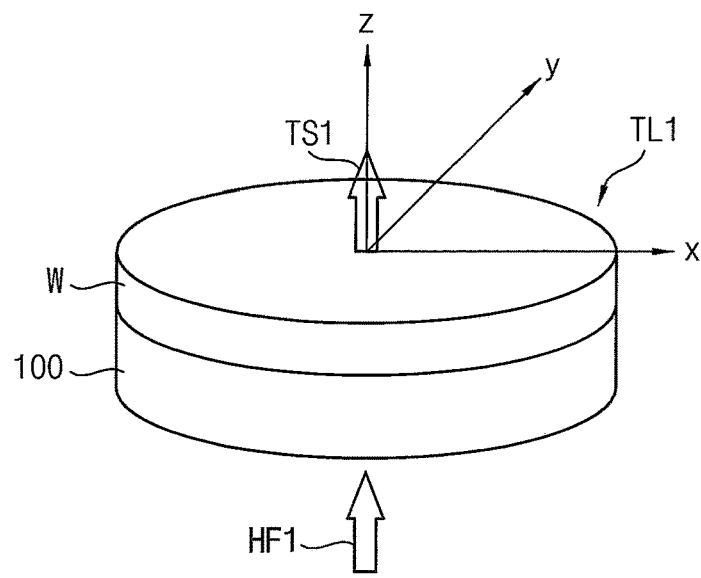
FIG. 6A is a perspective view illustrating a first transmission line in which the chuck dielectric plate and the substrate are stacked.
Figure 6B:
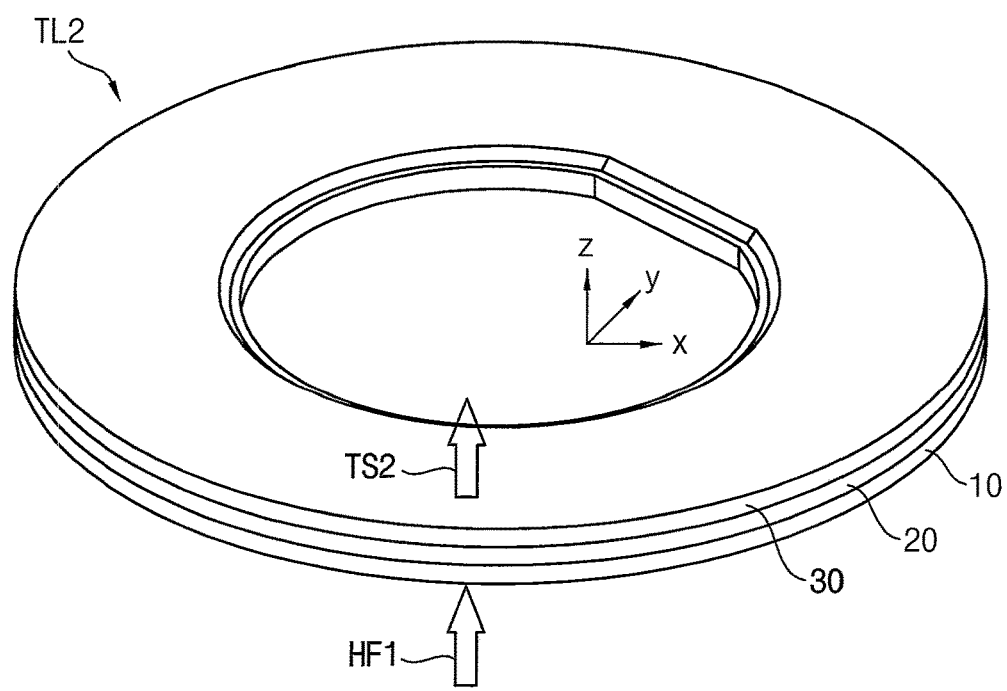
FIG. 6B is a perspective view illustrating a second transmission line in which the ring dielectric layer and the composite conductive layer are stacked.

As illustrated in FIGS. 6A and 6B, each of the first and the second transmission lines TL1 and TL2, e.g., paths, may be configured into a stack structure of dielectric materials and conductive materials, so the applied high frequency power may be transmitted to the plasma space via a resistor-capacitor (RC) circuit. Accordingly, the applied high frequency power may be attenuated in relation with the attenuation coefficient of each of the transmission lines TL1 and TL2, e.g., paths, and the first and the second transmission power signals TS1 and TS2 may have different energies over the substrate W and the focus ring 90, respectively.

The focus ring 90 may be configured to be higher than the substrate W in view of the erosion in the plasma treatment process. For example, as illustrated in FIG. 4, the upper surface 51 of the focus ring 90, e.g., an uppermost surface of the second conductive layer 20, may be higher than the upper surface of substrate W relative to a bottom of the chuck body 200. Accordingly, the length of the second transmission line TL2, i.e., a total thickness (or height) of the stacked structure of the dielectric layer 30 with the composite conductive layer 50, may be longer than that of the first transmission line TL1, i.e., a total thickness (or height) of the stacked structure of the chuck dielectric plate 100 and the substrate W. Thus, the high frequency power may be attenuated through the second transmission line TL2 more than through the first transmission line TL1, and the intensity of the second transmission power signal TS2 may be smaller than that of the first transmission power signal TS1. As a result, the plasma density on the focus ring 90 may be smaller than that on the substrate W.

The focus ring 90 may include the dielectric layer 30 and the composite conductive layer 50, in which the first and second conductive layers 10 and 20 having different specific resistances may be arranged. Thus, the attenuation through the second transmission line TL2 may be varied by the configurations and properties of the dielectric layer 30 and the composite conductive layer 50. Therefore, the intensity of the second transmission power signal TS2 may come close to that of the first transmission power signal TS1 by changing the configurations and properties of the focus ring 90, and the intensity difference between the first and the second transmission power signals TS1 and TS2 may be minimized by controlling the configurations and properties of the focus ring 90. It is noted that the dielectric layer 30 of the focus ring 90 may be referred to as a ring dielectric layer for comparison with the chuck dielectric plate 100.

When an alternating current power is applied to an RC circuit, an energy loss occurs in the RC circuit with respect to transmission loss caused by the resistance of the RC circuit and a time delay caused by the resistance and the capacitance of the RC circuit. The transmission loss is generally detected as a conductor loss at a surface area of a resistor of the RC circuit, and the time delay may be detected as a phase difference at the resistor and a capacitor of the RC circuit.

In the present example embodiment, the chuck dielectric plate 100 and the ring dielectric layer 30 of the focus ring 90 may be configured to have the same capacitance.

The energy loss in the alternating current power transmission is mainly caused by the conductor loss rather than the phase difference, and the capacitance of the RC circuit has much more effect on the phase difference rather than the resistance of the RC circuit. Thus, when the chuck dielectric plate 100 and the ring dielectric layer 30 have the same capacitance, the phase difference of the second transmission power signal TS2 may approach that of the first transmission power signal TS1.

Accordingly, the energy losses caused by the phase difference may be substantially the same between the first and the second power signals TS1 and TS2, and the intensity difference between the first and the second power signals TS1 and TS2 may be determined mainly by the conductor loss of the first and the second transmission lines TL1 and TL2. That is, the intensity difference between the first and the second power signals TS1 and TS2 may be minimized by experimentally determining the resistance of the composite conductive layer 50 of the focus ring 90 in such a way that the conductor loss of the second transmission power signal TS2 may come close to that of the first transmission power signal TS1.

Figure 5:
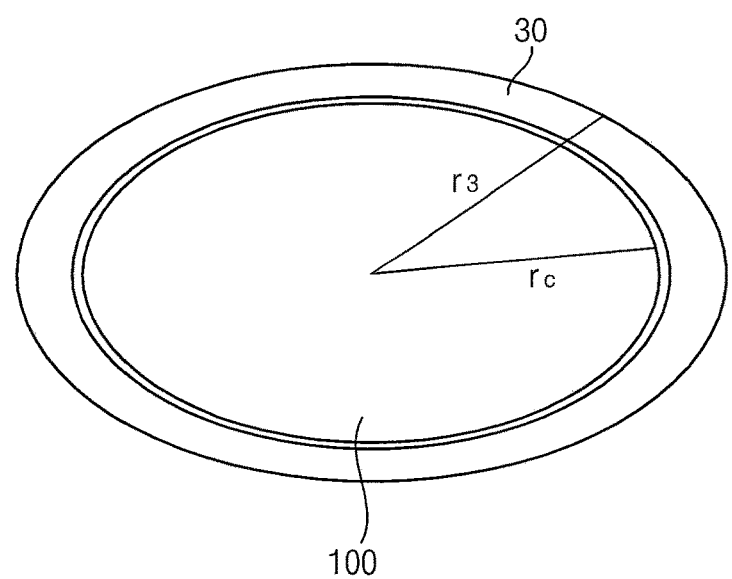
FIG. 5 is a plan view illustrating a chuck dielectric plate and a ring dielectric layer of the focus ring in the chuck assembly shown in FIG. 4.

FIG. 5 is a plan view illustrating the chuck dielectric plate 100 and the ring dielectric layer 30 of the focus ring 90 in the chuck assembly shown in FIG. 4.

Referring to FIG. 5, the ring dielectric layer 30 may be arranged on the stepped portion 201 of the chuck body 200 and be shaped into a ring enclosing the chuck dielectric plate 100. Thus, when a gap between the ring dielectric layer 30 and the chuck dielectric plate 100 is negligible, the chuck dielectric plate 100 may have a chuck radius $r_c$ and the ring dielectric layer 30 may have a ring radius $r_3$.

When the chuck dielectric plate 100 has a chuck thickness $t_c$, a chuck dielectric constant $c_c$, and a surface area $A_c$, and the ring dielectric layer 30 has a ring thickness $t_3$, a ring dielectric constant $\varepsilon_3$, and a ring surface area $A_3$, the capacitances of the chuck dielectric plate 100 and the ring dielectric layer 30 may be obtained as following equation (1) and (2), respectively. In equations (1) and (2) below, $C_c$ represents the capacitance of the chuck dielectric plate 100, and $C_3$ represents the capacitance of the ring dielectric layer 30, respectively.

$$C_c = \varepsilon_c \frac{A_c}{t_c} = \varepsilon_c \frac{\pi r_c^2}{t_c} \tag{1}$$

$$C_3 = \varepsilon_3 \frac{A_3}{t_3} = \varepsilon_3 \frac{\pi(r_3^2 - r_c^2)}{t_3} \tag{2}$$

Accordingly, the thickness $t_3$ of the ring dielectric layer 30 may be obtained by following equation (3) in such a way that the capacitance $C_3$ of the ring dielectric layer 30 may be substantially the same as the capacitance $C_c$ of the chuck dielectric plate 100.

$$t_3 = \frac{\varepsilon_3}{\varepsilon_c}\left(\left(\frac{r_3}{r_c}\right)^2 - 1\right)t_c \tag{3}$$

Particularly, when the chuck dielectric plate 100 and the ring dielectric layer 30 include the same dielectric materials, the thickness $t_3$ of the ring dielectric layer 30 may be smaller than that of the chuck dielectric plate 100. For example, the ring dielectric layer 30 may include any one of aluminum oxide ($Al_2O_3$), quartz, yttrium oxide ($Y_2O_3$) and compositions thereof.

FIG. 6A is a perspective view illustrating the first transmission line, e.g., path, TL1, in which the chuck dielectric plate 100 and the substrate W are stacked. FIG. 6B is a perspective view illustrating the second transmission line, e.g., path, TL2, in which the ring dielectric layer 30 and the composite conductive layer 50 are stacked.

Referring to FIGS. 4, 6A, and 6B, a high frequency power may be applied to the chuck body 200 and be transmitted to the plasma space over the substrate W through the first transmission line TL1 at the central portion C of the chuck body 200 and the second transmission line TL2 at the peripheral portion E of the chuck body 200. Thus, the high frequency power may be transferred to the first transmission power signal TS1 over the substrate W and to the second transmission power signal TS2 over the focus ring 90.

In such a case, the intensity of the first transmission power signal TS1 over the substrate W may be obtained as following equation (4). The intensity of the second transmission power signal TS1 over the focus ring 90 may be obtained as following equation (5).

$$S_{1x}(z,t) = S_0 e^{-\alpha_1 z} \cos(\omega t - \beta_1 z) \quad (4)$$

$$S_{2x}(z,t) = S_0 e^{-\alpha_2 z} \cos(\omega t - \beta_2 z) \quad (5)$$

In equations (4) and (5) above, z is a height direction of the chuck assembly 500, x is a radial direction of the chuck assembly 500, t is an arbitrary time after the high frequency power HF1 is applied to the chuck body 200, ω is an angular speed of the high frequency power HF1, $S_1$ and $S_2$ are the first and the second intensities, respectively, $\alpha_1$ and $\alpha_2$ are transmission coefficients of the first and the second transmission lines TL1 and TL2, respectively, and $\beta_1$ and $\beta_2$ are phase coefficients of the first and the second transmission lines TL1 and TL2, respectively. An arbitrary inner position of the transmission line can be determined by a coordinate in the radial direction x, so that the position of the skin depth of the transmission line can be determined by x-coordinate value. For example, $S_0$ indicates an initial intensity of the high frequency power HF1 at a moment when the high frequency power HF1 is applied to the chuck body 200, and $S_1$ indicates an arbitrary intensity of the first transmission power signal TS1 at an arbitrary time and an arbitrary radial position x of the first transmission line TL1. In the same way, $S_2$ indicates an arbitrary intensity of the second transmission power signal TS2 at an arbitrary time and an arbitrary radial position x of the second transmission line TL2.

Although the transmission loss of the high frequency power HF1 may occur along the radial direction x of the chuck assembly 500 as well as the height direction z of the chuck assembly 500, the transmission loss along the radial direction x may have no effect on the generation of the plasma over the substrate W. Thus, the transmission loss along the radial direction x may be negligible for minimizing the intensity difference between the first and the second transmission power signals TS1 and TS2.

Thus, the intensity of the first transmission power signal TS1 may be mainly determined by the attenuation coefficient $\alpha_1$ of the first transmission line TL1. The intensity of the second transmission power signal TS2 may be mainly determined by the attenuation coefficient $\alpha_2$ of the second transmission line TL2.

Therefore, when the attenuation coefficient $\alpha_1$ of the first transmission line TL1 is substantially the same as the attenuation coefficient $\alpha_2$ of the second transmission line TL2, the intensity difference between the first and the second transmission power signals TS1 and TS2 may be minimized. As a result, the uniformity of the plasma density may increase in the plasma space.

The attenuation coefficient α is generally expressed as following equation (6). In equation (6), B is a constant that is determined according to the permittivity and the permeability of the transmission line, f is a frequency of the high frequency power that is transmitted through the transmission line, w is an angular speed of the high frequency power, and ρ is a specific resistance of the transmission line.

$$\alpha = B\sqrt{\frac{f}{\rho}} = B\sqrt{\frac{\omega}{2\pi\rho}} \quad (6)$$

In the present example embodiment, as the same high frequency power may be applied to the first transmission line TL1 and the second transmission line TL2, the angular speed of the high frequency power may be the same in the first and the second transmission lines TL1 and TL2. Thus, the attenuation coefficients $\alpha_1$ and $\alpha_2$ of the first and the second transmission lines TL1 and TL2 may be reversely proportional to the square root of the specific resistance ρ of the corresponding transmission line.

Accordingly, when the composite conductive layer 50 of the focus ring 90 has a sufficiently large specific resistance, the attenuation coefficient $\alpha_2$ of the second transmission line TL2 may be sufficiently reduced. Thus, the intensity of the second transmission power signal TS2 may approach that of the first transmission power signal TS1.

The focus ring 90 may be shaped into a ring arranged on the stepped portion 201 of the chuck body 200 and enclosing the substrate W with a thickness greater than the substrate W. As such, the focus ring 300 may potentially be difficult to have a uniform specific resistance along a whole body. For that reason, the conductive material of the focus ring 300 may be configured into the first conductive layer 10 having a relatively smaller thickness and a smaller specific resistance and the second conductive layer 20 having a relatively greater thickness and a greater specific resistance. Thus, the focus ring 300 may include the composite conductive layer 50 including the first conductive layer 10 and the second conductive layer 20.

Since the specific resistance of the first conductive layer 10 is relatively small, and thus, the attenuation coefficient α of the first conductive layer 10 is relatively large, as suggested in equation (6), a relatively large amount of the conductive loss may occur at the first conductive layer 10 when the high frequency power HF1 is transmitted though the focus ring 90. In contrast, since the specific resistance of the second conductive layer 20 is relatively large, and thus, the attenuation coefficient α of the second conductive layer 20 is relatively small, as suggested in equation (6), a relatively small amount of the conductive loss may occur at the second conductive layer 20 when the high frequency power HF1 is transmitted though the focus ring 90. Particularly, the second conductive layer 20 may have such configurations that substantially no attenuation may occur at the second conductive layer 20.

Therefore, the attenuation of the high frequency power HF1 may be negligible at the chuck dielectric plate 100 and the ring dielectric layer 30, and most of the attenuation of the high frequency power HF1 may occur at the substrate W and the first conductive layer 10 of the focus ring 90. As the high frequency power HF1 is transmitted through the chuck assembly 500 in the height direction z, an overall attenuation of the high frequency power HF1 at the substrate W may be obtained by following equation (7) and an overall attenuation of the high frequency power HF1 at the first conductive layer 10 may be obtained by following equation (8).

$$t_w \alpha_w = t_w B_w \sqrt{\frac{f}{\rho_w}} \quad (7)$$

$$t_1 \alpha_1 = t_1 B_1 \sqrt{\frac{f}{\rho_1}} \quad (8)$$

Accordingly, the first thickness $t_1$ of the first conductive layer 10 may be determined in such a way that the overall attenuation of the high frequency power HF1 at the substrate W may approach the overall attenuation of the high frequency power HF1 at the first conductive layer 10 as much as possible, as expressed in equation (9).

$$t_1 = t_w \sqrt{\frac{\rho_1}{\rho_w}} \quad (9)$$

Thus, when the conductive material of the first conductive layer 10 is selected, and thus, the specific resistance of the first conductive layer 10 is determined, the first thickness $t_1$ of the first conductive layer 10 may be obtained by the above equation (9). That is, when the first thickness $t_1$ of the first conductive layer 10 satisfies equation (9), the intensity difference between the first transmission power signal TS1 and the second transmission power signal TS2 may be minimized on the substrate W and the focus ring 90.

In such a case, the second conductive layer 20 may have such a greater specific resistance than the first conductive layer 10 that substantially no attenuation may occur in the second conductive layer 20. For example, the specific resistance of the second conductive layer 20 may be about 100 times to about 1000 times the specific resistance of the first conductive layer 10. Accordingly, the intensity of the second transmission power signal TS2 may be substantially the same as that of the high frequency power HF1 transmitted through the first conductive layer 10.

As the third thickness $t_3$ of the ring dielectric layer 30 may be obtained by equation (3) and the first thickness $t_1$ of the first conductive layer 10 may be obtained by equation (9), the second thickness $t_2$ of the second conductive layer 20 may be obtained as the difference between the total thickness T of the focus ring 90 and the sum of the first and third thicknesses $t_1$ and $t_3$, as described in following equation (10). The total thickness T of the focus ring 300 may be provided as the specifications of the chuck assembly 500 according to the requirements of the plasma treatment process and the chamber characteristics of the plasma treatment apparatus having the chuck assembly 500.

$$t_2 = T - (t_1 + t_3) \quad (10)$$

In the present example embodiment, the substrate W may include a silicon wafer and the first conductive layer 10 may include silicon (Si), so that the first conductive layer 10 may have the same thickness as the substrate W. In addition, the second conductive layer 20 may include a high resistive conductive material, e.g., silicon carbide (SiC), and the total thickness T of the focus ring 300 may be in a range of about 3 mm to about 6 mm.

The first thickness $t_1$ obtained from equation (9) is based on the assumption that the transmission loss along the radial direction x of the second transmission line TL2 and the phase difference caused by the resistance is negligible, so that the intensity of the second transmission power signal TS2 may be somewhat deviated from the actual intensity of the second transmission power signal TS2.

Thus, the first thickness $t_1$ and the first specific resistance $\rho_1$ of the first conductive layer 10 may be experimentally obtained by the simulation based on equation (4) and equation (5). Thus, the intensity of the second transmission power signal TS2 may come much closer to that of the first transmission power signal TS1, thereby more accurately minimizing the intensity difference between the first and the second transmission power signals TS1 and TS2.

Figure 7:
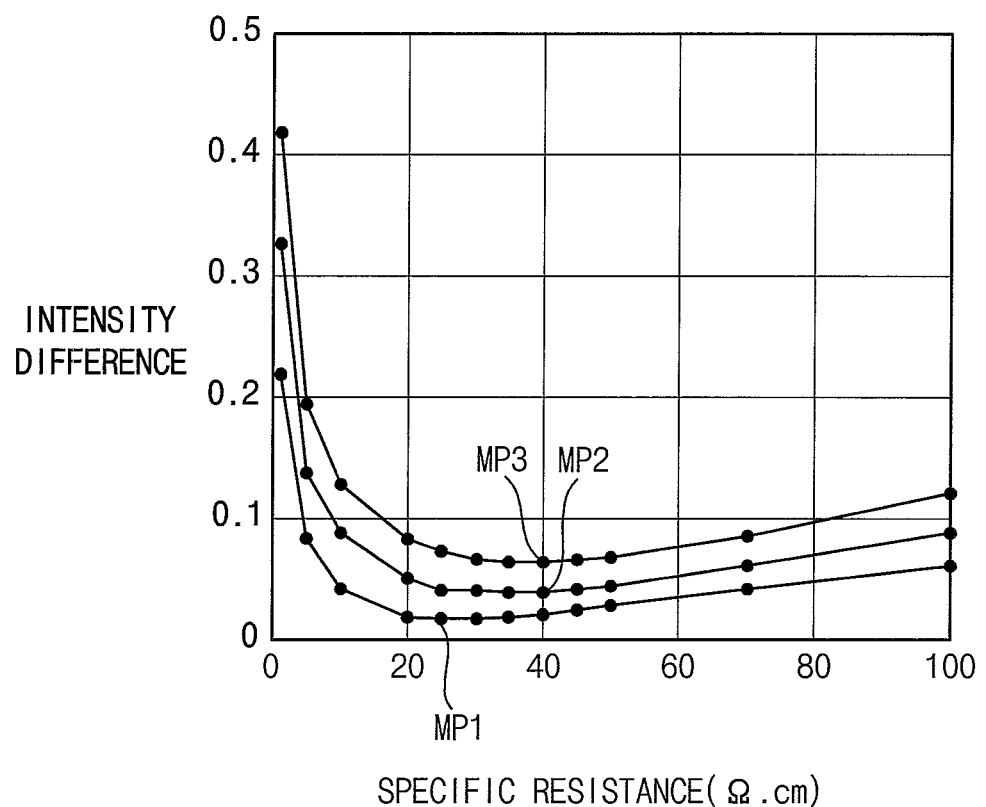
FIG. 7 is a graph showing the relations between the specific resistance of the first conductive layer of the focus ring and the intensity difference between the first and second transmission power signals with respect to various thicknesses of the first conductive layer.

FIG. 7 is a graph showing the relations between the specific resistance of the first conductive layer 10 of the focus ring 90 and the intensity difference between the first and second transmission power signals TS1 and TS2 with respect to various thicknesses of the first conductive layer 10. In FIG. 7, the variation of the intensity difference is shown according to the variation of the specific resistance of the first conductive layer 10 having the specific first thickness $t_1$, and a number of the first conductive layers 10 having different specific resistances are provided for a simulation for detecting the relations between the specific resistance and the intensity difference. Three simulations were conducted with respect to three first conductive layers 10 in which the first thickness $t_1$ was set to about 2 mm, 3 mm, and 4 mm, respectively, on the assumption that the first conductive layer 10 was made up of a material of which the permeability was the same as the permittivity.

As shown in FIG. 7, the intensity difference between the first and the second transmission power signal TS1 and TS2 is minimized at a particular point of the specific resistance of each of the first conductive layers 10. When the first thickness $t_1$ of the first conductive layer 10 is about 2 mm, the intensity difference is minimized at a first minimal point MP1, and when the first thickness $t_1$ of the first conductive layer 10 is about 3 mm, the intensity difference is minimized at a second minimal point MP2. In the same way, when the first thickness $t_1$ of the first conductive layer 10 is about 4 mm, the intensity difference is minimized at a third minimal point MP3. Among the three minimal points MP1, MP2, and MP3, the intensity difference is the smallest when the first thickness $t_1$ is about 2 mm.

Accordingly, the simulation results in FIG. 7 indicate that the specific resistance and the thickness are simultaneously obtained at the minimal point at which the intensity difference is minimized. Hereinafter, the specific resistance and the thickness at the minimal point where the intensity difference is the smallest are referred to as minimal specific resistance and minimal thickness. Thus, when the first conductive layer 10 may be configured to have the minimal specific resistance and the minimal thickness as the first specific resistance $\rho_1$ and the first thickness $t_1$, the intensity difference between the first and the second transmission power signals TS1 and TS2 may be minimized over the substrate W and the focus ring 90. In the present example embodiment, when the first conductive layer 10 has the first thickness $t_1$ of about 2 mm and the first specific resistance $\rho_1$ of about 25 Skm, the intensity difference between the first and the second transmission power signals TS1 and TS2 may be minimized.

According to the above simulations, the intensity of the first transmission power signal TS1 and the intensity of the second transmission power signal TS2 may be individually calculated by using a computer system, and an arithmetic difference between the intensities may be obtained at each specific resistances. Thus, the transmission loss along the radial direction and the phase difference caused by the resistance, which may be neglected for effectiveness of equation (9), may be reflected in the results of the computer simulation shown in FIG. 7.

Accordingly, the first thickness $t_1$ and the first specific resistance $\rho_1$ of the first conductive layer 10 determined by the computer simulation may decrease the intensity difference more than the first thickness $t_1$ and the first specific resistance $\rho_1$ of the first conductive layer 10 calculated from equation (9).

The third thickness $t_3$ of the ring dielectric layer 30 may be obtained by equation (3) and the first thickness $t_1$ of the first conductive layer 10 may be obtained by the simulation results as shown in FIG. 7, and then the second thickness $t_2$ of the second conductive layer 20 may be determined by equation (10).

For example, the insulating plate 400 may be arranged under the chuck body 200 and may support the chuck body 200. The insulating plate 400 may have a surface area corresponding to the chuck body 200, so that the chuck body 200 may be, e.g., completely, supported by the insulating plate 400. Thus, the chuck body 200 may be sufficiently insulated from a grounding plate, which may be arranged at a lower portion of the chuck assembly 500, by the insulating plate 400. Particularly, the insulating plate 400 may be configured to have such a shape and a material that the capacitance between the chuck body 200 and the insulating plate 400 may be minimized.

The insulating plate 400 may include a single insulation body or a multiple layer structure having at least two insulation layers having different dielectric constants. Thus, leakage current through the insulating plate 400 may be sufficiently prevented and the plasma density may not be deteriorated over time.

A shield ring SR may be extended from the insulating plate 400 in such a configuration that the side surfaces of the chuck body 200 and the focus ring 300 may be enclosed by the shield ring SR. The shield ring SR may have such a sufficiently large dielectric constant that a sufficient impedance may occur between the chuck body 200 and the shield ring SR, and thus, the high frequency power HF1 may be prevented from loss toward the side portion of the chuck assembly 500. For example, the shield ring SR may include a dielectric materials having the dielectric constant less than about 5, e.g., quartz, silicon carbide (SiC) and silicon oxide ($SiO_2$).

In addition, as the shield ring SR may enclose the chuck body 200 and the focus ring 300. Therefore, the chuck body 200 and the focus ring 300 may be sufficiently prevented from being damaged from the plasma, residual source gases, and various particles of the plasma treatment process.

The ground plate may also be arranged under the insulating plate 400. The ground plate may be shaped into the same shape as the insulating plate 400, so that the ground plate may be, e.g., completely, covered by the insulating plate 400. The high frequency power HF1 may be applied to the chuck body 200 via a power line penetrating the ground line.

While the present example embodiment discloses that the ring dielectric layer 30 may be arranged under the first conductive layer 10, the ring dielectric layer 30 may also be arranged on the second conductive layer 20 as described in detail with reference to FIG. 3 according to the requirements of the plasma treatment process.

According to the example embodiment of the chuck assembly 500, the first thickness $t_1$ and the first specific resistance of the first conductive layer 10 of the focus ring 90 may be obtained by a theoretical calculation or by a computer simulation in such a way that the intensity difference between the first and the second transmission power signals TS1 and TS2 may be minimized. Thus, when the plasma etching process may be conducted on the substrate W, the density of the plasma over the substrate W may be sufficiently uniform across the substrate W, thereby improving the etching uniformity of the substrate W from the central portion to the peripheral portion.

Figure 8:
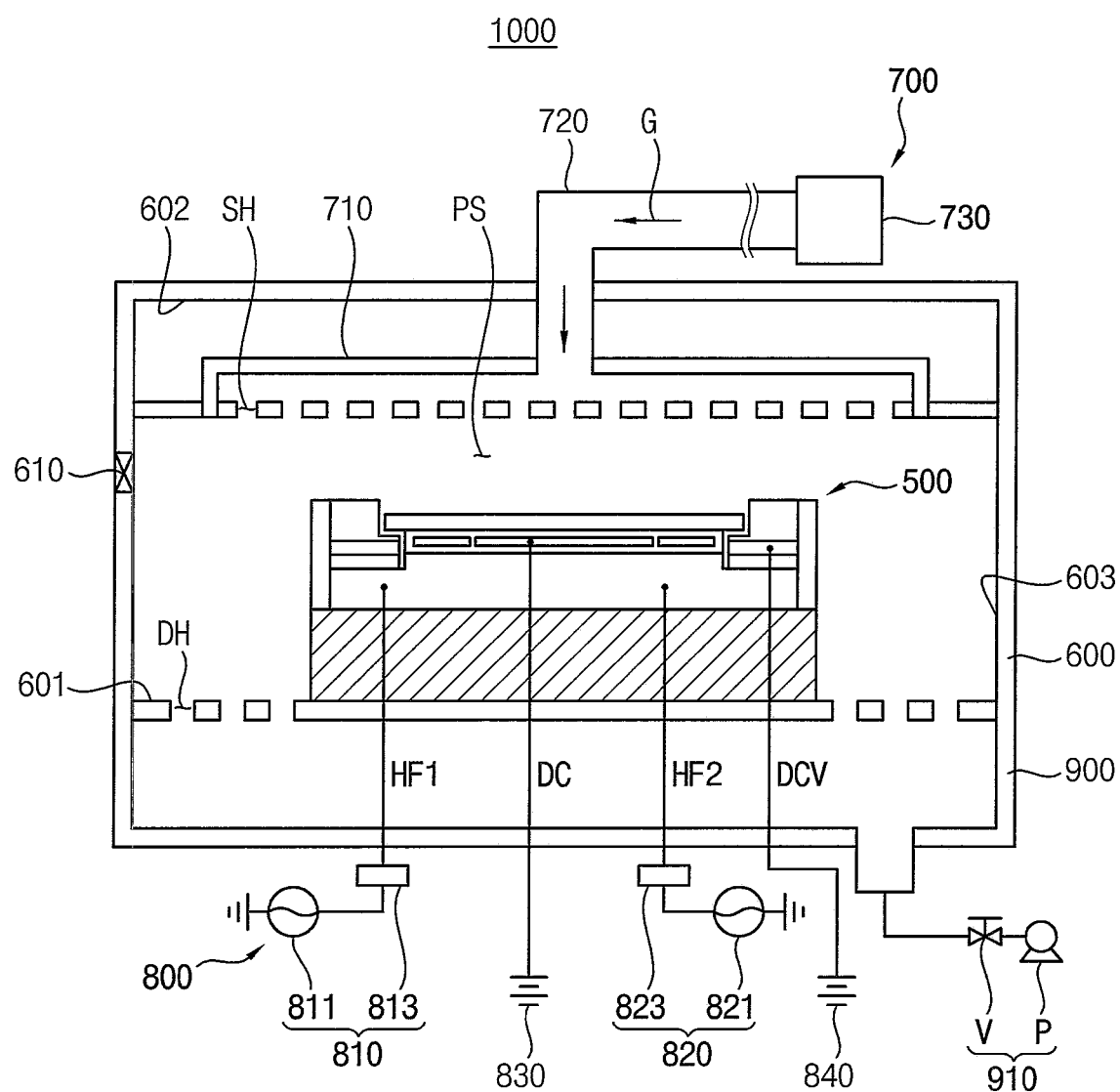
FIG. 8 is a structural view illustrating a plasma treatment apparatus having the chuck assembly shown in FIG. 4 in accordance with an example embodiment.

FIG. 8 is a structural view illustrating a plasma treatment apparatus having the chuck assembly 500 of FIG. 4 in accordance with an example embodiment.

Referring to FIG. 8, a plasma treatment apparatus 1000 in accordance with an example embodiment may include a process chamber 600 having a process space PS in which a plasma treatment process may be conducted, a source supplier 700 arranged at an upper portion of the process chamber 600 and supplying source gases G for the plasma treatment process, the chuck assembly 500 arranged at a lower portion of the process chamber 600 and chucking the substrate W to be processed by the plasma treatment process, and a power supplier 800 applying at least high frequency power to the chuck assembly 500 and generating plasma for the plasma treatment process in the process space PS. Hereinafter, the process space PS of the process chamber 600 may be often referred to as plasma space because the plasma for the plasma treatment process is generated in the process space over the substrate W.

The chuck assembly 500 of the plasma treatment apparatus 1000 may have substantially the same structure as described in detail with reference to FIGS. 4 to 7. Thus, in FIG. 8, the same reference numerals denote the same elements as in FIGS. 4 to 7, and any further detailed descriptions of the same elements will be omitted hereinafter.

Referring to FIG. 8, the process chamber 600 may include a 3-dimensional structure having the process space PS therein and have a sufficient strength and rigidity for the plasma treatment process. In the present example embodiment, the process chamber 600 may include a bottom 601, a ceiling 602 opposite to the bottom 601, and a plurality of side walls 603 interposed between the bottom 601 and the ceiling 602.

A gate 610 may be provided with one of the side wall 603 through which the substrate W may be loaded into the process chamber 600 or unloaded from the process chamber 600. The chuck assembly 500 may be arranged on the bottom 601 of the process chamber 600, and the substrate W may be secured to the chuck assembly 500.

In detail, the chuck assembly 500 may be arranged on a central portion of the bottom 601 of the process chamber 600 and a plurality of discharge holes DH may be arranged though the bottom 601 around the chuck assembly 500. Residual gases and byproducts of the plasma treatment process may be discharged from the process chamber 600 through the discharge holes DH.

A collection chamber 900 may be arranged under the process chamber 600 and be communicated with the process chamber 600 via the discharge holes DH, so that the residual gases and the byproducts of the plasma treatment process may be collected in the collection chamber 900. A pump structure 910 may be provided at a lower portion or a side portion of the collection chamber 900, and the residual gases and the byproducts of the plasma treatment process may be forced to discharge out of the process chamber 600. In the present example embodiment, the pump structure 910 may include a flow control valve V and a vacuum valve P.

While the present example embodiment discloses that the process chamber 600 is provided as a whole housing having the single gate 610 for loading and unloading the substrate W, any other configurations may be implanted in the process chamber according to the characteristics of the plasma treatment apparatus. For example, the process chamber 600 may include a lower housing and an upper housing that may be combined to with each other. Thus, when the substrate W is loaded into or unloaded from the process chamber 600, the lower and the upper housings may be separated from each other and the process space PS may be exposed to surroundings. In contrast, when the plasma treatment process is conducted in the process chamber 600, the upper and the lower housings may be combined to each other in such a structure that the process space PS may be separated from surroundings.

In the present example embodiment, the plasma treatment process may include a plasma etching process by which the source gases may be changed into the plasma in the process space PS and the etching process may be conducted on the substrate by using the plasma. However, any other plasma treatment process may be conducted in the plasma treatment apparatus 1000 as long as the focus ring is arranged around the substrate W and a high frequency power is applied to the chuck assembly 500 so as to generate the plasma in the process chamber PS of the process chamber 600.

For example, the source supplier 700 may be arranged at an upper portion of the process chamber 600 opposite to the chuck assembly 500. The source supplier 700 may include a gas supplier 710 supplying the source gases G into the process space PS through a plurality of supply holes SH, a source line 720 transferring the source gases G to the gas supplier 710, and a source tank 730 arranged at an exterior of the process chamber 600 and connected to the source line 720.

The gas supplier 710 may be shaped into a cubic structure having a size larger than the substrate W, so that the substrate W may be sufficiently covered by the gas supplier 710. An upper portion of the gas supplier 710 may be connected to the source line 720, and the plurality of the supply holes SH may be arranged at a lower portion of the gas supplier 710 facing the process space PS. Thus, the source gases G may be transferred into the gas supplier 710 through the source line 720 and may be uniformly supplied into the process space PS though the plurality of the supply holes SH. In the present example embodiment, the gas supplier 710 may include a shower head having a size sufficiently covering the substrate W.

The source gases G may be varied according to the characteristics and requirements of the plasma treatment process. For example, the source gases G may include chlorine fluoride ($Cl_xF_y$), chlorine ($Cl_2$) gases, bromide hydrogen (HBr), etc.

The chuck assembly 500 may be arranged on the bottom of the process chamber 600, and the substrate W may be secured onto the chuck assembly 500. Thus, the process space PS may be provided between the substrate W and the gas supplier 710. The source gases G may be supplied into the process space PS and be changed into the plasma over the substrate W for the plasma treatment process in the process space PS, so that the process space PS may function as the plasma space in which the plasma may be generated. The first high frequency power HF1 may be applied to the chuck assembly 500 for generating the plasma and the second high frequency power HF2 may be applied to the chuck assembly 500 for guiding the plasma onto the substrate W.

The chuck assembly 500 may include the composite conductive layer 50 and the ring dielectric layer 30 on or below the composite conductive layer 50. The composite conductive layer 50 may include the first conductive layer 10 having a relatively small thickness and a relatively small specific resistance and a second conductive layer 20 having a relatively great thickness and a relatively great specific resistance.

The first high frequency power HF1 may be transmitted to the process space PS or the plasma space through the first transmission line TL1, including the chuck dielectric plate 100 and the substrate W, as the first transmission power signal TS1 and through the second transmission line TL2, including the focus ring 90, as the second transmission power signal TS2. In such a case, the intensity difference between the first and the second transmission power signals TS1 and TS2 may be minimized by controlling the thickness and the specific resistance of the first conductive layer 10 of the focus ring 90.

As the intensity difference may be minimized over the substrate W, the density of the plasma may be uniform across the central portion to the peripheral portion of the substrate W, thereby sufficiently increasing the plasma uniformity across the substrate W.

The power supplier 800 may be arranged at an exterior of the process chamber 600 and may be connected to the chuck body 200 of the chuck assembly 500. For example, the power supplier 800 may include a first power source 810 for generating the first high frequency power HF1 and applying the first high frequency power HF1 to the chuck body 200 to change the source gases to the plasma for the plasma treatment process in the process space PS, a second power source 820 for generating the second high frequency power HF2 and applying the second high frequency power HF2 to the chuck body 200 to guide the charged particles of the plasma onto the substrate W in the process space PS, and a third power source 830 for generating a direct current (DC) power and applying the DC power to the securing electrode in the chuck dielectric plate 100 to secure the substrate W to the chuck dielectric plate 100.

The first power source 810 may include a first AC generator 811 and a first impedance matcher 813. The first AC generator 811 may generate the first high frequency power HF1 and the first impedance matcher 813 may include a transformer and a plurality of matching circuits for synchronizing the impedance between the first AC generator 811 and the chuck body 200.

The first high frequency power HF1 may include an alternating current power having a frequency of about 10 MHz to about 100 MHz and may be transmitted to the process space PS as the first transmission power signal TS1 through the first transmission line TL1 and the second transmission power signal TS2 through the second transmission line TL2. In the present example embodiment, the intensity difference between the first and the second transmission power signals TS1 and TS2 may be minimized by controlling the thickness and the dielectric constant of the ring dielectric layer 30 and the thickness and the specific resistance of the first conductive layer 10.

The source gases G may be changed into active ions and radicals by the first and the second transmission power signals TS1 and TS2 in the process space PS, so that the plasma for the plasma treatment process may be generated in the process space PS by the first and the second transmission power signals TS1 and TS2. In the present example embodiment, the plasma may include etching plasma for patterning or etching a thin layer on the substrate W.

The second power source 820 may include a second AC generator 821 and a second impedance matcher 823. The second AC generator 821 may generate the second high frequency power HF2 and the second impedance matcher 823 may include a transformer and a plurality of matching circuits for synchronizing the impedance between the second AC generator 821 and the chuck body 200.

Particularly, the frequency of the second high frequency power HF2 may be about 0.01 times to about 0.1 times the frequency of the first high frequency power HF1. Thus, the second high frequency power HF2 may include an alternating current power having a frequency of about 1 MHz to about 10 MHz. The active ions and radicals of the plasma may be accelerated onto the substrate W by the second high frequency power HF2 and the plasma treatment process may be conducted on the substrate W by the plasma.

As the attenuation coefficient is reversely proportional to a square root of the frequency, as shown in equation (6), and the frequency of the second high frequency power HF2 may be about 0.01 times to about 0.1 times the frequency of the first high frequency power HF1, the attenuation of the second high frequency power HF2 may be negligible as compared with the attenuation of the first high frequency power HF1. Thus, the second high frequency power HF2 may be uniformly transmitted to the process power PS, so the active ions and radicals of the plasma may be uniformly accelerated onto the substrate W across the central portion C to the peripheral portion E.

The third power source 830 may apply the DC power to the securing electrode in the chuck dielectric plate 100. An electrostatic force may be generated from the securing electrode and the substrate W may be secured to the chuck dielectric plate 100 of the chuck assembly 500.

According to the present example embodiment of the plasma treatment apparatus, the transmission loss of the second transmission power signal TS2 may come close to that of the first transmission power signal TS1 by controlling the dielectric constant and thickness of the ring dielectric layer 30 and the thickness and the specific resistance of the first conductive layer 10 of the focus ring 90. Thus, the intensity difference between the first and the second transmission power signals TS1 and TS2 may be minimized in the plasma treatment apparatus 1000, thereby improving the uniformity of the plasma treatment process to the substrate W.

According to the example embodiments, the focus ring 90 and 91 for focusing the plasma onto the substrate W may include the composite conductive layer 50 and the dielectric layer 10, with the composite conductive layer 50 including the first conductive layer 10 having a relative small thickness and a relatively small specific resistance and the second conductive layer 20 having a relative great thickness and a relatively great specific resistance. The dielectric layer 30 may have such a thickness and dielectric constant that the capacitance of the dielectric layer may be substantially the same as that of the chuck dielectric plate to which the substrate may be secured. The first conductive layer of the focus ring may have such a thickness and a specific resistance that the attenuation of the second transmission power signal transmitting through the focus ring may come close to that of the first transmission power signal transmitting through the chuck dielectric plate and the substrate. The second conductive layer of the focus ring may have such a great specific resistance that no transmission loss may occur when the high frequency power may be transmitted through the second conductive layer.

Thus, the intensity difference between the first and the second transmission power signals TS1 and TS2 may be minimized in the plasma treatment apparatus 1000, thereby improving the uniformity of the plasma treatment process to the substrate W. Particularly, when the plasma treatment process is conducted to a large diameter substrate W, e.g., a wafer, the density difference of the plasma may be significant between the central portion C and the peripheral portion E of the substrate W. However, according to the present example embodiment of the chuck assembly and the plasma treatment apparatus, the plasma density may become sufficiently uniform across the central portion C to the peripheral portion E of the substrate W.

By way of summation and review, when high frequency power is applied to a chuck assembly and is transmitted to a plasma space via the chuck and substrate and via the focus ring, the time delay and the attenuation of the high frequency power may be different when transmitting through the chuck and when transmitting through the focus ring. For example, as the focus ring is made of materials different from those of the substrate and the chuck, and as the focus ring is configured into structures different from those of the substrate and the chuck, the time delay and the attenuation of the high frequency power may be different when the high frequency power is transferred to the substrate via a central portion of the chuck assembly including the chuck and when the high frequency power is transferred to a peripheral portion of the chuck assembly including the focus ring.

As the focus ring usually has a thickness higher than that of the substrate, in view of the erosion of the plasma process, the attenuation of the high frequency power at the focus ring is greater than that of the high frequency power at the substrate. Thus, the intensity of the electric field generated in the plasma space by the high frequency power is much smaller around the focus ring than around the substrate. Accordingly, the plasma density is much smaller over the focus ring than over the substrate, which may cause process defects during the plasma process at the peripheral portion of the substrate.

Accordingly, an improved focus ring, in which the intensity difference of the electric field between the substrate and the focus ring can be minimized when the high frequency power is applied to the chuck assembly has been required. Therefore, example embodiments provide a focus ring in which a composite conductive layer including a high resistive layer and a low resistive layer and a dielectric layer are stacked on each other, to thereby minimize the intensity difference of the electric field generated by the high frequency power between the substrate and the focus ring. Example embodiments also provide a chuck assembly for a plasma treatment process having the above focus ring, as well as a plasma treatment apparatus including the above chuck assembly.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A focus ring, comprising:
   a first conductive layer having a first thickness and a first specific resistance;

a second conductive layer stacked on the first conductive layer, the second conductive layer having a second thickness greater than the first thickness and a second specific resistance greater than the first specific resistance; and a dielectric layer on one of a lower surface of the first conductive layer or an upper surface of the second conductive layer, wherein the second specific resistance is 10 times to 100 times the first specific resistance.

2. The focus ring as claimed in claim 1, wherein the first specific resistance is in a range of 10 Ωcm to 100 Ωcm.

3. The focus ring as claimed in claim 1, wherein the first conductive layer includes silicon (Si) and the second conductive layer includes silicon carbide (SiC).

4. A chuck assembly for securing a substrate, comprising:
a chuck dielectric plate including a dielectric material to support the substrate;
a chuck body including a conductive material, the chuck body supporting the chuck dielectric plate such that at least a high frequency power is applied to the chuck body; and
a focus ring on a peripheral portion of the chuck body to enclose the substrate, the focus ring including:
a first conductive layer having a first specific resistance,
a second conductive layer on the first conductive layer, the second conductive layer having a second specific resistance different from the first specific resistance, and the first and second conductive layers being combined into a composite conductive layer, and
a ring dielectric layer on one of a lower surface or an upper surface of the composite conductive layer,
wherein the ring dielectric layer has a thickness satisfied by following equation (1), $$t_3 = \frac{\varepsilon_3^2}{\varepsilon_c}\left(\left(\frac{r_3}{r_c}\right)^2 - 1\right)t_c, \tag{1}$$

wherein $t_3$ denotes the thickness of the ring dielectric layer, $t_c$ denotes a thickness of the chuck dielectric plate, $\varepsilon_3$ denotes a dielectric constant of the ring dielectric layer, $\varepsilon_c$ denotes a dielectric constant of the chuck dielectric plate, $r_3$ denotes a radius of the ring dielectric layer from a center position of the chuck body, and $r_c$ denotes a radius of the chuck dielectric plate from the center position of the chuck body.

5. The chuck assembly as claimed in claim 4, wherein the ring dielectric layer includes any one of aluminum oxide ($Al_2O_3$), quartz, yttrium oxide ($Y_2O_3$) and compositions thereof.

6. The chuck assembly as claimed in claim 5, wherein the chuck dielectric plate includes substantially a same material as the ring dielectric layer.

7. The chuck assembly as claimed in claim 5, wherein the composite conductive layer includes:
the first conductive layer with a first thickness and the first specific resistance, and
the second conductive layer with a second thickness greater than the first thickness and the second specific resistance greater than the first specific resistance.

8. The chuck assembly as claimed in claim 7, wherein the first thickness is larger than a thickness of the substrate and satisfies a following equation (2), $$t_1 = t_w\sqrt{\frac{\rho_1}{\rho_w}} \quad (\text{단}, \rho_1 \geq \rho_w), \tag{2}$$

wherein $t_1$ denotes the first thickness of the first conductive layer, $t_w$ denotes the thickness of the substrate, $\rho_1$ denotes the first specific resistance of the first conductive layer, and $\rho_w$ denotes a specific resistance of the substrate.

9. The chuck assembly as claimed in claim 7, wherein the high frequency power includes:
a first transmission power signal transmitting through a first transmission line, which includes the chuck dielectric plate and the substrate and has a first intensity satisfied by a following equation (3), and
a second transmission power signal transmitting through a second transmission line, which includes the focus ring and has a second intensity satisfied by a following equation (4), $$S_{1x}(z,t) = S_0 e^{-\alpha_1 z}\cos(\omega t - \beta_1 z) \tag{3}$$

$$S_{2x}(z,t) = S_0 e^{-\alpha_2 z}\cos(\omega t - \beta_2 z) \tag{4},$$

wherein z is a position along a height direction of the chuck assembly, x is a position along a radial direction of the chuck assembly, t is an arbitrary time after the high frequency power is applied to the chuck body, ω is an angular speed of the high frequency power, $S_1$ and $S_2$ are the first and the second intensities, respectively, $\alpha_1$ and $\alpha_2$ are transmission coefficients of the first and the second transmission lines, respectively, and $\beta_1$ and $\beta_2$ are phase coefficients of the first and the second transmission lines, respectively, and
wherein the first thickness and the first specific resistance include a minimal thickness and a minimal specific resistance that are simultaneously obtained by a computer simulation from a minimal point at which a difference between the first intensity and the second intensity is minimized.

10. The chuck assembly as claimed in claim 9, wherein the minimal point is detected as a point in a graph of the first conductive layer at which the intensity differences between the first intensity and the second intensity is the smallest, the graph indicating relations between specific resistances of the first conductive layer and the intensity differences between the first intensity and the second intensity on condition that the first thickness of the first conductive layer is set.

11. The chuck assembly as claimed in claim 7, wherein the second thickness of the second conductive layer is satisfied by a following equation (5), $$t_2 = T - (t_1 + t_3) \tag{5},$$

wherein $t_1$ denotes the first thickness of the first conductive layer and T denotes a total thickness of the focus ring.

12. The chuck assembly as claimed in claim 4, wherein the chuck dielectric plate includes at least a securing electrode, the securing electrode overlapping a center of the chuck body.

13. The chuck assembly as claimed in claim 4, wherein the conductive material of the chuck body includes any one of aluminum (Al), titanium (Ti), tungsten (W), stainless steel, and compositions thereof.

14. A plasma treatment apparatus for conducting a plasma treatment process to a substrate, comprising:
a process chamber having a process space in which the plasma treatment process is conducted;

a source supplier at an upper portion of the process chamber to supply source gases for the plasma treatment process;

a chuck assembly at a lower portion of the process chamber to secure the substrate; and a power supplier to apply at least a high frequency power to the chuck assembly and to generate a plasma for the plasma treatment process in the process space, wherein the chuck assembly includes:
a chuck dielectric plate including a dielectric material to support the substrate,
a chuck body including a conductive material, the chuck body supporting the chuck dielectric plate such that at least the high frequency power is applied to the chuck body, and
a focus ring on a peripheral portion of the chuck body to enclose the substrate, the focus ring including:
a first conductive layer having a first specific resistance,
a second conductive layer on the first conductive layer, the second conductive layer having a second specific resistance different from the first specific resistance, and the first and second conductive layers being combined into a composite conductive layer,
a ring dielectric layer on one of a lower surface or an upper surface of the composite conductive layer,
wherein the ring dielectric layer has a thickness satisfied by following equation (6), $$t_3 = \frac{\varepsilon_3}{\varepsilon_c}\left(\left(\frac{r_3}{r_c}\right)^2 - 1\right)t_c, \tag{6}$$

wherein $t_3$ denotes the thickness of the ring dielectric layer, $t_c$ denotes a thickness of the chuck dielectric plate, $\varepsilon_3$ denotes a dielectric constant of the ring dielectric layer, $\varepsilon_c$ denotes a dielectric constant of the chuck dielectric plate, $r_3$ denotes a radius of the ring dielectric layer from a center position of the chuck body and $r_c$ denotes a radius of the chuck dielectric plate from the center position of the chuck body.

15. The plasma treatment apparatus as claimed in claim 14, wherein the composite conductive layer includes:
the first conductive layer having a first thickness and the first specific resistance, and
the second conductive layer having a second thickness greater than the first thickness and the second specific resistance greater than the first specific resistance.

16. The plasma treatment apparatus as claimed in claim 15, wherein the first thickness is larger than a thickness of the substrate and satisfies a following equation (7), $$t_1 = t_w\sqrt{\frac{\rho_1}{\rho_w}} \; (\text{단}, \; \rho_1 \geq \rho_w), \tag{7}$$

wherein $t_1$ denotes the first thickness of the first conductive layer, $t_w$ denotes the thickness of the substrate, $\rho_1$ denotes the first specific resistance of the first conductive layer, and $\rho_w$ denotes a specific resistance of the substrate.

17. The plasma treatment apparatus as claimed in claim 15, wherein the high frequency power includes a first transmission power signal transmitting along a first transmission line having the chuck dielectric plate and the substrate and having a first intensity satisfied by a following equation (8) and a second transmission power signal transmitting along a second transmission line having the focus ring and having a second intensity satisfied by a following equation (9), $$S_{1x}(z,t) = S_0 e^{-\alpha_1 z} \cos(\omega t - \beta_1 z) \tag{8}$$

$$S_{2x}(z,t) = S_0 e^{-\alpha_2 z} \cos(\omega t - \beta_2 z) \tag{9},$$

wherein z is a position along a height direction of the chuck assembly, x is a position along a radial direction of the chuck assembly, t is an arbitrary time after the high frequency power is applied to the chuck body, $\omega$ is an angular speed of the high frequency power, $S_1$ and $S_2$ are the first and the second intensities, respectively, $\alpha_1$ and $\alpha_2$ are transmission coefficients of the first and the second transmission lines, respectively, and $\beta_1$ and $\beta_2$ are phase coefficients of the first and the second transmission lines, respectively, and wherein the first thickness and the first specific resistance includes a minimal thickness and a minimal specific resistance that are simultaneously obtained by a computer simulation from a minimal point at which a difference between the first intensity and the second intensity is minimized.

\* \* \* \* \*